US008700874B2

(12) United States Patent
Chen et al.

(10) Patent No.: US 8,700,874 B2
(45) Date of Patent: Apr. 15, 2014

(54) DIGITAL COUNTER SEGMENTED INTO SHORT AND LONG ACCESS TIME MEMORY (75) Inventors: Edmund G. Chen, Sunnyvale, CA (US); Brian Alleyne, Los Gatos, CA (US); Robert Hathaway, Sunnyvale, CA (US); Ranjit J. Rozario, San Jose, CA (US); Todd D. Basso, San Jose, CA (US)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 417 days.

(21) Appl. No.: 12/890,479

(22) Filed: Sep. 24, 2010

(65) Prior Publication Data

US 2012/0079228 A1   Mar. 29, 2012

(51) Int. Cl.
*G06F 12/00*   (2006.01)
(52) U.S. Cl.
USPC ........... 711/167; 711/168; 711/169; 708/100; 377/51
(58) Field of Classification Search
None
See application file for complete search history.

(56) References Cited

U.S. PATENT DOCUMENTS

| | | | | |
|---|---|---|---|---|
| 3,440,410 A * | 4/1969 | Offereins | ......................... | 377/50 |
| 2005/0025055 A1 | 2/2005 | Jain et al. | | |
| 2005/0240745 A1 | 10/2005 | Iyer et al. | | |
| 2006/0212778 A1 * | 9/2006 | Wheeler et al. | ............... | 714/764 |
| 2007/0133419 A1 * | 6/2007 | Segel | ............................ | 370/236 |
| 2007/0174575 A1 * | 7/2007 | Lovett | ............................ | 711/167 |
| 2008/0165914 A1 * | 7/2008 | Horgan | ............................ | 377/51 |

* cited by examiner

*Primary Examiner* — Matthew Bradley
*Assistant Examiner* — Daniel Tsui
(74) *Attorney, Agent, or Firm* — Blakely Sokoloff Taylor & Zafman LLP (57) ABSTRACT A method performed in a memory controller for maintaining segmented counters split into primary and secondary memories, the primary memory faster. Events occur that require incrementing one of the segmented counters and the memory controller responds by incrementing a corresponding primary part in the primary memory. Each time a primary part is rolling over the memory controller determines that a secondary part should be updated. Also, the memory controller periodically determines that the secondary part of a segmented counter should be opportunistically updated. The opportunistic update is based on a probability function and a random number. The secondary part includes at least all of bits of the segmented counter not in the primary part and is stored in the secondary memory. Each time an update to the secondary part occurs, both the secondary part and primary part of the segmented counter must be updated.

18 Claims, 5 Drawing Sheets

DIGITAL COUNTER SEGMENTED INTO SHORT AND LONG ACCESS TIME MEMORY

FIELD OF THE INVENTION

Embodiments of the invention relate generally to the field of high speed digital counters; and more particularly, to segmenting a digital counter into a short access time memory and a long access time memory.

BACKGROUND

There are many applications in computing that require high speed digital counters. For instance, in the field of telecommunications there are digital counters for many statistics. Particularly, many network elements maintain counters for statistics such as incoming packets, outgoing packets, and packets falling within particular categories. It is particularly important that these counters be able to increment at very high rates to maintain accurate statistics as events requiring counting occur very quickly.

For example, in some telecommunication applications that utilize network elements for packet based communication it is necessary to count the number of incoming packets. As each packet arrives at a line card in a network element an incoming packet counter is incremented to keep track of the number of incoming packets. As the speed of telecommunication increases, the rate at which packets arrive to a network element increases as well. Thus, the speed at which a counter increments must increase accordingly.

Furthermore, the number of simultaneous counters that have to be maintained can be in the hundreds of thousands or millions, and maintaining the counter state to keep up with the count rate is difficult and costly. Fast memory comes at an increase in size, power, or cost. For example, in a given technology point, an external RL-DRAM component is about 4 times faster, 4 times smaller, and 16 times more expensive than an equivalent DDR-DRAM component. Hence there exists a desire to have the size and cost of the slower memory along with the performance of the faster memory.

SUMMARY OF THE INVENTION

Embodiments of the invention include a method performed in a memory controller for maintaining segmented counters. The memory controller is coupled to a primary memory and a secondary memory. In this embodiment, the primary memory has a shorter access time than the secondary memory. During processing, events occur that require updating one of the segmented counters. The memory controller responds to these events by immediately updating a primary part of the segmented counter. The primary part includes the lower order bits and is stored in the primary memory. Furthermore, each time the primary part of a segmented counter is rolling over, the memory controller determines that the secondary part of the segmented counter should be updated. The secondary part includes at least all of bits of the segmented counter not included in the primary part and is stored in the secondary memory. Furthermore, the memory controller periodically and independently of the events requiring an update, determines that the secondary part of a segmented counter should be opportunistically updated. Each time it is determined to update the secondary part of the segmented counter, whether opportunistically or because of an event, both the secondary part and primary part of the segmented counter must be updated. The opportunistic update is based on a probability function and a current at least pseudo-random number such that updates of the secondary parts of the segmented counter are distributed probabilistically over time.

Embodiments of the invention also include a memory controller configured to maintain segmented counters. The memory controller is coupled to a primary memory and a secondary memory. In this embodiment, the primary memory has a shorter access time than the secondary memory. The memory controller comprises a statistics module and a secondary memory access queue. The secondary memory access queue is coupled between the secondary memory and the statistic module. The statistics module is configured to initiate updates of the segmented counters. Each segmented counter comprises a primary part to be stored in the primary memory and a secondary part to be stored in the secondary memory. The primary part includes the lower order bits while the secondary part includes at least all of bits of the segmented counter not included in the primary part. The statistics module comprises an opportunistic update module and a forced update module. The opportunistic update module is configured to determine a probability function corresponding to each of the segmented counters and to probabilistically initiate one or more opportunistic updates of the secondary parts based on the determined probability functions. The forced update module is configured to initiate one or more forced updates of the secondary parts. The secondary memory access queue is configured to store one or more secondary memory access requests at least one of which is a request to update one of the secondary parts. The secondary memory access queue is further configured to perform the one or more secondary memory access requests. In this way, updates of the secondary parts are distributed probabilistically over time.

Embodiments of the invention include a line card configured to maintain segmented counters, each of which is comprised of a primary part and a secondary part. The primary parts include the lower order bits, while the secondary parts include at least all of bits of the segmented counters not included in the primary parts. The line card is comprised of one or more packet processor cores, a primary memory, a secondary memory, and a memory controller. The packet processor cores are configured to transmit instructions where at least one of the instructions indicates that one of the segmented counters should be updated and at least one of the instructions indicates a request for the state of one of the segmented counters. The primary memory is configured to store the primary parts of the segmented counters, and the secondary memory is configured to store the secondary parts of the segmented counters. In this embodiment, the primary memory has a shorter access time than the secondary memory. The memory controller is coupled between the one or more packet processor cores, the primary memory, and the secondary memory. The memory controller is configured to receive instructions from the one or more packet processor cores and is comprised of an opportunistic update module and forced update module. The opportunistic update module is configured to periodically determine, for each of the segmented counters, based on a probability function and an at least pseudo-random number, whether to opportunistically update the secondary parts. In this embodiment, updates of the secondary parts results in resets of the primary parts. The forced update module is configured to determine, based on the received instructions, to update the secondary part of the segmented counters associated with the received instructions. The forced update module is further configured to determine, based on the avoidance of the primary parts of the segmented counters rolling over without updates of the secondary parts, to force updates to the secondary parts so that failures of the opportunistic update module to opportunistically update the secondary parts and reset the primary parts prior to roll over is avoided. In this way, updates of the secondary parts are distributed probabilistically over time.

BRIEF DESCRIPTION OF THE DRAWINGS

The present invention is illustrated by way of example, and not by way of limitation, in the figures of the accompanying drawings in which like references indicate similar elements. The invention may best be understood by referring to the following description and accompanying drawings that are used to illustrate embodiments of the invention. In the drawings.

DETAILED DESCRIPTION

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

By way of example, embodiments of the invention include the implementation of the segmented counters in telecommunications equipment to provide high speed counters that maintain accurate network statistics. Specifically, many pieces of network equipment, such as network elements, maintain numerous real-time statistics that are used to keep track of many data points such as network channel usage, bandwidth availability, and resource usage by individual customer's or devices. These statistics are used in some places for billing purposes and in other places for network maintenance and quality of service assurance. Still other places may utilize the statistics to track equipment needs or prioritize equipment upgrades. Therefore, it is important that counters be accurate so that the statistics the counters represent are also accurate. While embodiments of the invention are described in terms of network technology, alternative embodiments of the invention may implement the segmented counters anywhere that high speed counters are required. The segmented counters are particularly desirable whenever events requiring counting ("countable events") occur at very high rates, the count values are sufficiently large, and the cardinality of counters is large enough such that either the primary memory is too limited or too expensive to implement the counters in the traditional manner.

Methods and apparatus are described for maintaining a plurality of segmented counters. Each of the segmented counters includes a primary and a secondary part respectively stored in a primary and secondary memory, where the primary part includes the lower order bits and the secondary part includes at least all of bits of the segmented counter not included in the primary part (such as the higher order bits). The primary part of a given segmented counter is updated every time a countable event occurs. Every time the primary part rolls over, the secondary part must be updated. This can lead to the secondary memory being overwhelmed when a sufficiently large number of the secondary parts need updating at the same time (e.g., the worst case scenario where all of the secondary parts need updating at the same time). In an effort to avoid this, the secondary parts are opportunistically updated based on a probability function and an at least pseudo-random number, and each such opportunistic update causes the corresponding primary part to be updated in a manner that makes it further from its roll over point. In this way, updates of the secondary parts stored in the slower secondary memory are distributed probabilistically over time, thus avoiding a bottleneck at the secondary memory.

Figure 1:
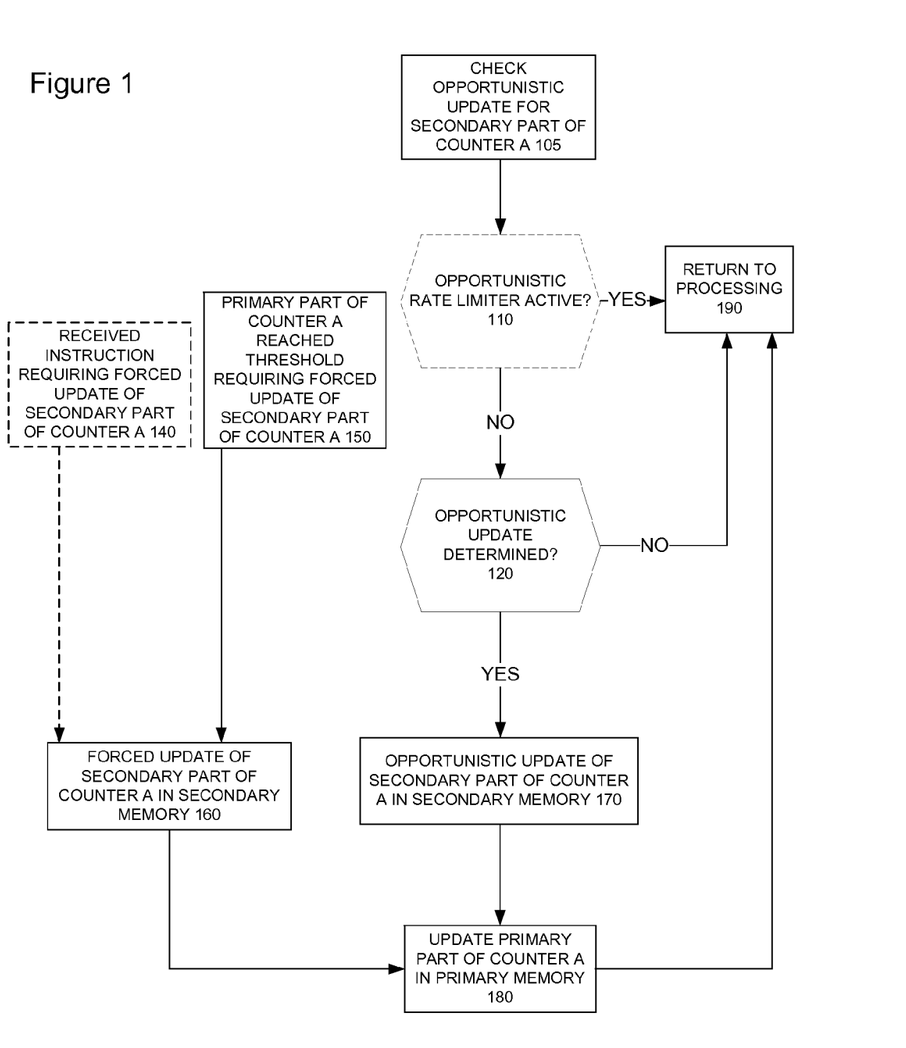
FIG. 1 is a flow chart illustrating a method for maintaining a plurality of segmented counters according to embodiments of the invention.

FIG. 1 is a flow chart illustrating a method for maintaining a plurality of segmented counters according to embodiments of the invention. This flow chart shows one embodiment for ensuring that updates to the secondary parts are spread over time. The figure illustrates a series of steps of a method as individual blocks. Some steps are optional, depending on the particular embodiment, and are shown in dashed markings to indicate the step may or may not be present in each embodiment.

FIG. 1 begins at the top with a block 105 indicating a point during processing when the system checks whether to opportunistically update the secondary part of segmented counter A. As discussed above, primary parts of each segmented counter are incremented each time a countable event occurs. Independently of that incrementing, it may be determined that the secondary part of a segmented counter should be opportunistically updated (i.e., prior to the primary part reaching a threshold value indicating a need to be adjusted to prevent the primary part from rolling over its limit).

In one embodiment of the invention, it is first checked whether an opportunistic rate limiter is active 110—depicted as a dashed block connected below block 105 via an arrow going from 105 to 110. The opportunistic rate limiter throttles the number of opportunistic updates so that a congestion to the secondary memory is avoided. If the opportunistic rate limiter is active then the system continues on to its processing 190—depicted to the right of block 110 and connected to via an arrow from 110 to 190. If the opportunistic rate limiter is not active, then the system continues on to determine whether an opportunistic update should be performed 120. The details of the opportunistic rate limiter are further described with reference to later figures. Alternative embodiments perform the checks 110 and 120 in the opposite order, checking first if an opportunistic update should be performed 120 and second if an opportunistic rate limiter 110 is active. Other embodiments perform the checks 110 and 120 in parallel fashion.

It is then determined whether an opportunistic update of the segmented counter A should occur 120—depicted as a decision block below the optional check for an active opportunistic rate limiter 110 and connected via an arrow from 110 to 120. If it is determined that an opportunistic update should not occur, then the system continues on to its processing 190—which is shown as an arrow from 120 to 190. If it is determined that an opportunistic update should occur, then the flow moves down to update the secondary part of counter A 170, which is stored in secondary memory.

The determination of whether to run an opportunistic update of a segmented counter may be implemented differently in different embodiments. For example, in one embodiment a probability function is assigned to each segmented counter. Each time a determination of whether to opportunistically update a counter needs to be made, a random number—either a pseudo-random number or a truly-random number (the term "at least pseudo-random number" is used to refer to both)—is used with the probability function to make a probabilistic determination. In another embodiment, a random number is compared with the current value stored in the primary part of the segmented counter and the result of that comparison is used to determine whether to perform the update. In yet another embodiment, the selection of the probability function is based, at least in part, on the current value stored in the primary part of the segmented counter and the limit of that primary part. In this way, primary parts that are closer to their limit have a higher probability of generating an opportunistic update than primary parts that are farther from their limits.

FIG. 1 continues with the step of updating the secondary part of counter A 170, which is stored in secondary memory—depicted as a block 170 connected below block 120 via an arrow going from 120 to 170. This step is followed below by the update of the primary part of counter A 180 to a value that is further from its limit (e.g., resetting it to zero)—depicted as block connected below block 170 via an arrow going from 170 to 180. The update of the secondary part and primary part of the segmented counters is described with reference to the following figures. After the update of the primary part of segmented counter A, the system continues its processing 190 shown as an arrow going from 180 to 190. Alternative embodiments perform the updates 170 and 180 in the opposite order, first updating the primary part 180 and second updating the secondary part 170. Other embodiments perform the updates 170 and 180 in parallel fashion.

As described above, updates of the secondary part of counter A 170 are expected to occur responsive to opportunistic updates, however updates are also forced when necessary. In other words, since the opportunistic update are not guaranteed to occur frequently enough to prevent the primary part from rolling over, it is desirable to allow for a threshold value to be set such that when that threshold value is reached by the primary part of segmented counter A 150, a forced update may occur 160. The forced update 160—depicted in FIG. 1 via block 160 to the left of block 180 and connected via an arrow going from 160 to 180—occurs in the same fashion as block 170. Furthermore, in at least one embodiment, the system may receive an instruction requiring the forced update of segmented counter A's secondary part—depicted as a dashed block connected to block 160 via an arrow going from 140 to 160. For example, such a forced update is required in some embodiments of the invention responsive to an instruction to read the value of segmented counter A (the secondary part of segmented counter A must be updated to include the value stored in the primary part of counter before the value of segmented counter A can be returned).

Figure 2:
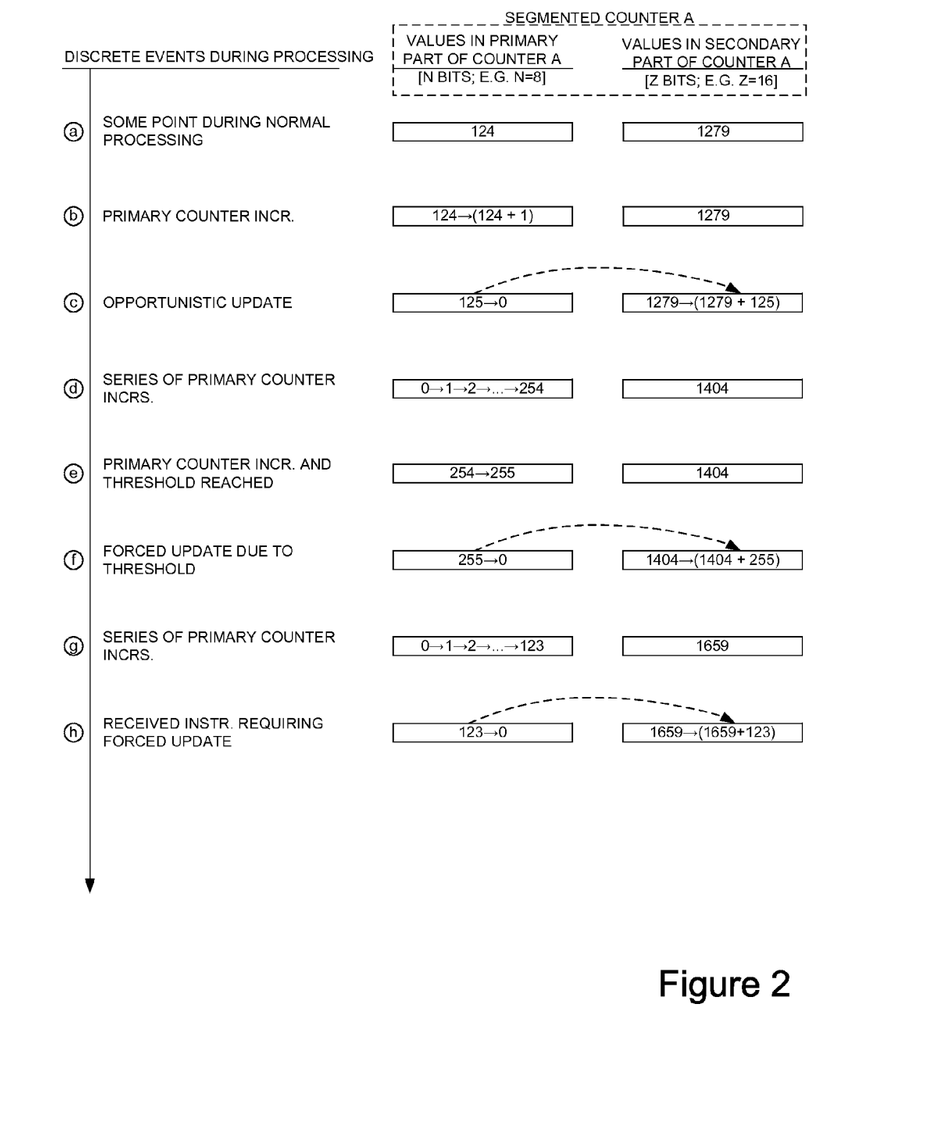
FIG. 2 is a data flow diagram illustrating the maintaining of a plurality of segmented counters according to embodiments of the invention.
Figure 3:
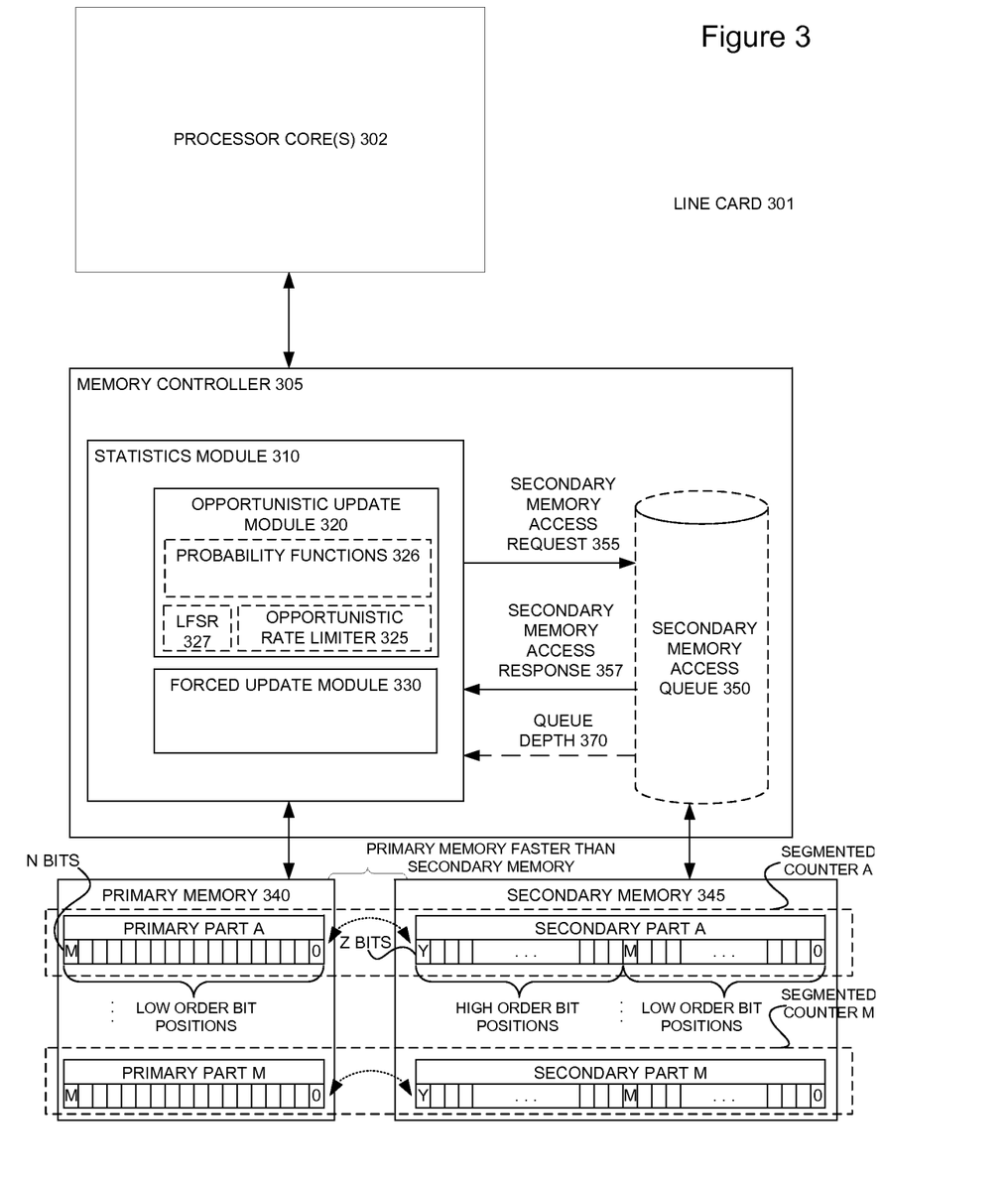
FIG. 3 is a block diagram illustrating a line card of a network element including a memory controller, a primary memory, and a secondary memory in which a plurality of segmented counters are maintained according to a first embodiment of the invention.
Figure 4:
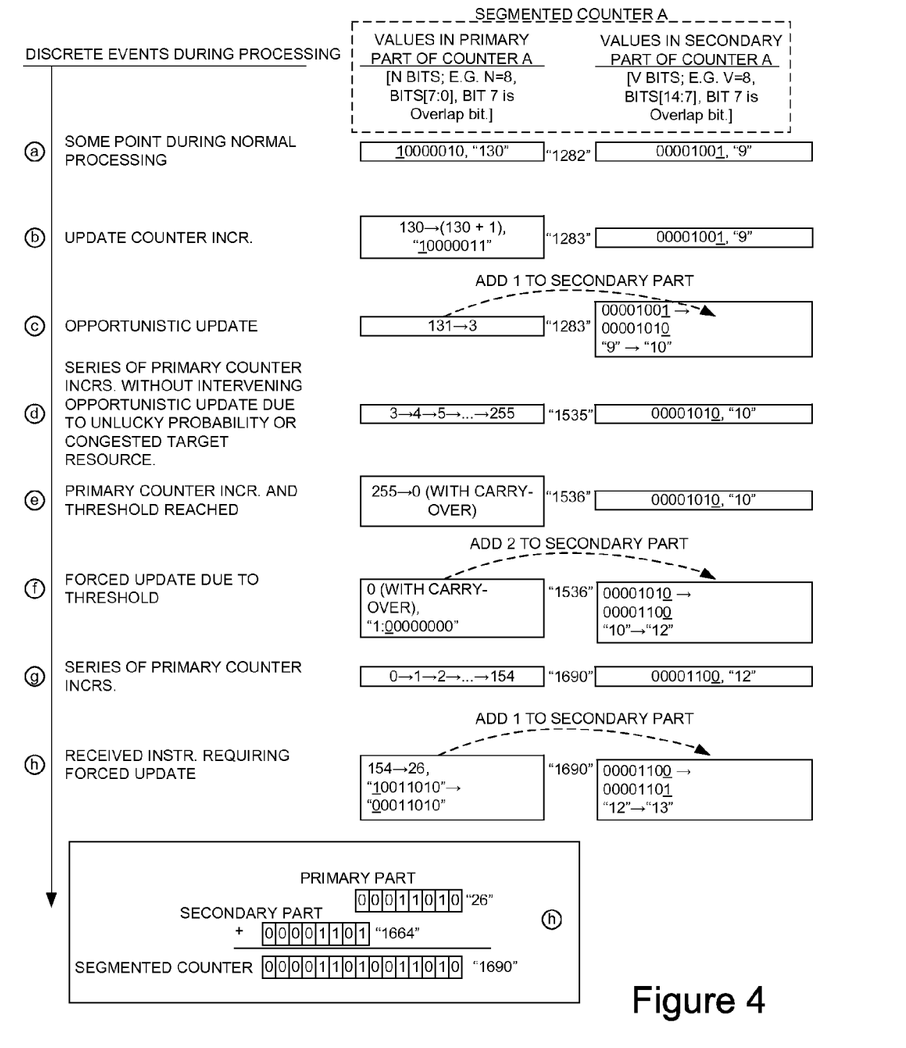
FIG. 4 is a data flow diagram illustrating the maintaining of a plurality of segmented counters according to embodiments of the invention.
Figure 5:
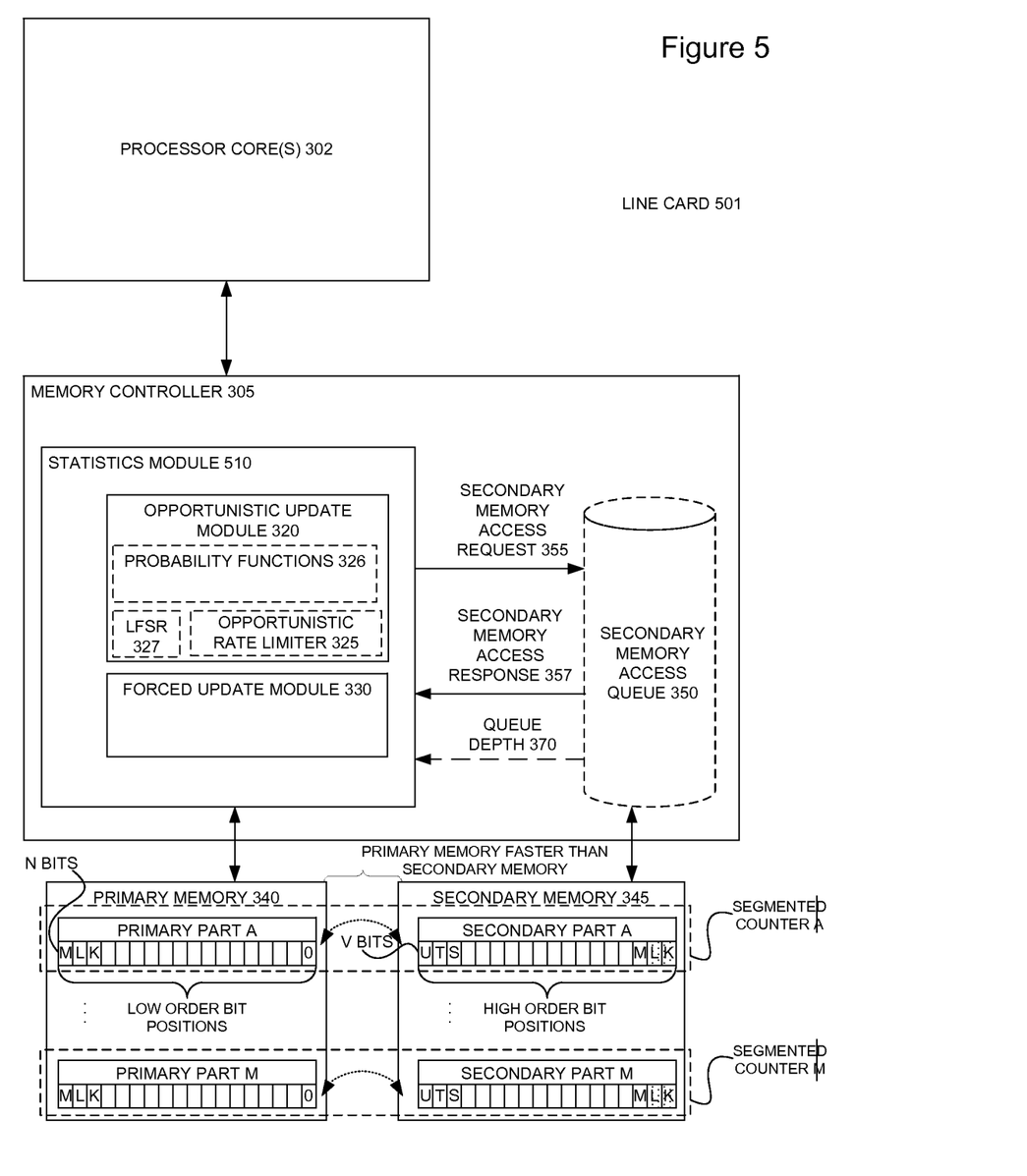
FIG. 5 is a block diagram illustrating a line card of a network element including a memory controller, a primary memory, and a secondary memory in which a plurality of segmented counters are maintained according to a second embodiment of the invention.

FIGS. 2 and 3 illustrate one exemplary way of maintaining the segmented counter, while FIGS. 4 and 5 illustrate an alternative exemplary way.

FIG. 2 is a data flow diagram illustrating the maintaining of a plurality of segmented counters according to embodiments of the invention. Along the left is a vertical line, running the length of the figure and ending with an arrow pointing towards the bottom, depicting the progression of time. Along the top are three headings for three vertical columns: "Discrete Events During Processing," "Values in Primary Part of Counter A," and "Values in Secondary Part of Counter A." The headings for the values of the primary part and second part of counter A are enclosed in a dashed box and labeled segmented counter A to show that those two pieces are logically coupled to form the segmented counter A. Under the primary part heading and the secondary part heading are labels indicating exemplary numbers of bits stored in the primary part and the secondary part of counter A. Specifically, FIG. 2 illustrates a segmented counter with 16 total bits, with its primary part having 8 bits and its secondary part having 16 bits. Going down the figure, eight discrete rows (a)-(h) are labeled in the first column and the corresponding values stored in the primary part and secondary part of counter A are indicated in the second and third column respectively.

The first discrete row shown (a) is some point during normal processing in the system. The value of segmented counter A is 1403 at this particular point in processing, with 1279 being stored in the secondary part of counter A and 124 being stored in the primary part of counter A. At discrete row (b), segmented counter A is incremented, making the total 1404, with 125 in the primary part and 1279 in the secondary part.

At discrete row (c), it is determined that an opportunistic update of the secondary part of segmented counter A should occur. This determination occurs as described with reference to FIG. 1. At this point, a dashed arrow is shown going from the primary part to the secondary part to indicate that the value in the primary part is to be added to the secondary part. The secondary part transitions from 1279 to 1404 (1279 plus 125). The primary part transitions from 125 to 0, showing that the primary part has been reset (that is, updated to a value further from its roll over point).

Discrete row (d) indicates that a series of increments to segmented counter A have occurred incrementing the value of the primary part from 0 to 254; the value stored in the secondary part is still 1404 at this point. Although increments are showing as each adding 1 to the primary part, alternative embodiments may increment the primary part by amounts greater than 1 as well.

At discrete row (e), the segmented counter A is again incremented raising the value in the primary part to 255, which is the primary part's threshold limit given 8 bits. Discrete row (f) shows a forced update of the segmented counter A. A dashed arrow is shown going from the primary part to the secondary part to indicate that the value 255 from the primary part is to be added to the secondary part. The primary part is shown transitioning from 255 to 0 and the secondary part is shown transitioning from 1404 to 1659 (1404 plus 255). In another embodiment, the forced update of segmented counter A is responsive to the primary part rolling over from 255 to 0 and a carry-over flag being set to indicate the roll-over. In this embodiment the forced update would cause 256 to be added to the secondary part of segmented counter A.

Discrete row (g) indicates that a series of increments to segmented counter A have occurred incrementing the value of the primary part from 0 to 123; the value stored in the secondary part is still 1659 at this point.

Discrete row (h) shows a forced update that occurred in response to receiving an instruction that required a forced update, as described with reference to FIG. 1. A dashed arrow is shown going from the primary part to the secondary part to indicate that the value 123 from the primary part is to be added to the secondary part. The primary part is shown transitioning from 123 to 0 and the secondary part is shown transitioning from 1659 to 1782 (1659 plus 123). Therefore, FIG. 2 shows the inter-relationship between the primary part and the secondary part of the segmented counter in accordance with one embodiment of the invention.

FIG. 3 is a block diagram illustrating a line card of a network element including a memory controller, a primary memory, and a secondary memory in which a plurality of segmented counters are maintained according to a first embodiment of the invention. The line card 301 includes a memory controller 305, a primary memory 340, and a secondary memory 345 in which a plurality of segmented counters is maintained according to embodiments of the invention.

As used herein, a network element (e.g., a router, switch, bridge) is a piece of networking equipment, including hardware and software, that communicatively interconnects other equipment on the network (e.g., other network elements, end stations). Some network elements are "multiple services network elements" that provide support for multiple networking functions (e.g., routing, bridging, switching, Layer 2 aggregation, session border control, Quality of Service, and/or subscriber management), and/or provide support for multiple application services (e.g., data, voice, and video). Subscriber end stations (e.g., servers, workstations, laptops, netbooks, palm tops, mobile phones, smartphones, multimedia phones, Voice Over Internet Protocol (VoIP) phones, user equipment, terminals, portable media players, GPS units, gaming systems, set-top boxes) access content/services provided over the Internet and/or content/services provided on virtual private networks (VPNs) overlaid on (e.g., tunneled through) the Internet. The content and/or services are typically provided by one or more end stations (e.g., server end stations) belonging to a service or content provider or end stations participating in a peer to peer service, and may include, for example, public webpages (e.g., free content, store fronts, search services), private webpages (e.g., username/password accessed webpages providing email services), and/or corporate networks over VPNs. Typically, subscriber end stations are coupled (e.g., through customer premise equipment coupled to an access network (wired or wirelessly)) to edge network elements, which are coupled (e.g., through one or more core network elements) to other edge network elements, which are coupled to other end stations (e.g., server end stations).

Network elements are commonly separated into a control plane and a data plane (sometimes referred to as a forwarding plane or a media plane). In the case that the network element is a router (or is implementing routing functionality), the control plane typically determines how data (e.g., packets) is to be routed (e.g., the next hop for the data and the outgoing port for that data), and the data plane is in charge of forwarding that data. For example, the control plane typically includes one or more routing protocols (e.g., Border Gateway Protocol (BGP), Interior Gateway Protocol(s) (IGP) (e.g., Open Shortest Path First (OSPF), Routing Information Protocol (RIP), Intermediate System to Intermediate System (IS-IS)), Label Distribution Protocol (LDP), Resource Reservation Protocol (RSVP)) that communicate with other network elements to exchange routes and select those routes based on one or more routing metrics.

Routes and adjacencies are stored in one or more routing structures (e.g., Routing Information Base (RIB), Label Information Base (LIB), one or more adjacency structures) on the control plane. The control plane programs the data plane with information (e.g., adjacency and route information) based on the routing structure(s). For example, the control plane programs the adjacency and route information into one or more forwarding structures (e.g., Forwarding Information Base (FIB), Label Forwarding Information Base (LFIB), and one or more adjacency structures) on the data plane. The data plane uses these forwarding and adjacency structures when forwarding traffic.

In one embodiment, a network element includes a set of one or more line cards, a set of one or more control cards, and optionally a set of one or more service cards (sometimes referred to as resource cards). These cards are coupled together through one or more mechanisms (e.g., a first full mesh coupling the line cards and a second full mesh coupling all of the cards). The set of line cards make up the data plane, while the set of control cards provide the control plane and exchange packets with external network element through the line cards. The set of service cards can provide specialized processing (e.g., Layer 4 to Layer 7 services (e.g., firewall, IPsec, IDS, P2P), VoIP Session Border Controller, Mobile Wireless Gateways (GGSN, Evolved Packet System (EPS) Gateway)). By way of example, a service card may be used to terminate IPsec tunnels and execute the attendant authentication and encryption algorithms. Alternative embodiments may use different network element architectures (e.g. where there is not separation of line cards and control cards).

The line card 301 illustrated in FIG. 3 operates in a manner as described in FIGS. 1 and 2. This figure includes modules that are optional depending on the specific implementation and shown in dashed boxes. In FIG. 3, a memory controller 305 is coupled between one or more processor cores 302, a primary memory 340, and a secondary memory 345 where the primary memory has a shorter access time than the secondary memory.

Different embodiments may implement the processor core(s) 302, the memory controller 305, the primary memory 340, and the secondary memory 345 in different manners of integration (e.g., they may each be separate application specific integrated circuit (ASICS) in separate packages; the processor core(s) 302, the memory controller 305, and the primary memory 340 may be on one ASIC, while the secondary memory 345 is in another (and they may share or have separate packages); the primary memory 340 may be on one ASIC and controlled by a first memory controller 305 that is in communication with a second memory controller 305 coupled to the secondary memory 345 on a second ASIC; there may be a first die with processor core(s) 302, a second die with the memory controller 305 and the primary memory 340, and a third die with the secondary memory 345 (and they may share or have separate packages); and any of the other possible combinations).

While in one embodiment the primary memory is RL-DRAM (reduced-latency dynamic random access memory), alternative embodiments may use other types of memory (e.g., eDRAM (embedded dynamic random access memory)). With respect to the secondary memory, while one embodiment utilizes DDR-DRAM (double date rate dynamic random access memory), alternative embodiments may utilize other types of memory (e.g., SDR-DRAM (single date rate dynamic random access memory)).

The memory controller 305 comprises a statistics module 310 that maintains a plurality of segmented counters. Each segmented counter is comprised of a primary part stored in the primary memory 340 and a secondary part stored in the secondary memory 345. In this embodiment, the primary part includes the low order bit positions while the secondary part includes both the low order and the high order bit positions of the segmented counter. For example, the primary part contains N bits, shown as bit positions 0 through M (N minus 1), while the secondary part contains Z bits, shown as bit positions 0 through Y (Z minus 1). The secondary part includes bit positions 0 through M (in other words, the segmented counter has Z bits and the secondary part also has Z bits, but the value of the secondary part only reflects the value of the segmented counter when the value of the primary part equals 0). With reference to FIG. 2, N may be 8 while Z may be 16. In FIG. 3, the primary part and the secondary part of each segmented counter are shown in a relationship with a curved-dashed line ending with arrows on each end. This line is to indicate that the two parts are logically coupled to make up a segmented counter.

Different embodiments of the invention may implement different sized segmented counters (Z bits) with different sized primary parts (N bits). For example, in one embodiment of the invention, one segmented counter is 16 bits wide, capable of storing the unsigned values 0 through 65,535, and the primary part of the 16 bit segmented counter is 8 bits wide, capable of storing the unsigned value 0 through 255. In another embodiment one segmented counter is 64 bits wide, 0 through $1.84 \times 10^{19}$, and the primary part of the 64 bit counter is 32 bits wide, 0 through $4.29 \times 10^9$. Therefore, the segmented counter is capable of storing a larger value than the primary part of the segmented counter alone. As the counter increases, the primary part of the segmented counter will approach the primary part's limit (i.e., the roll over point); in the case of an 8 bit primary part the limit would be 255. As this limit approaches, it becomes necessary to update a secondary part of the segmented counter and decrease the primary part back to a value less than the limit based on the method of updating.

The statistics module 310 is coupled between the primary memory 340 and the secondary memory 345. As each countable event occurs, the primary part of the associated segmented counter is incremented in the primary memory 340. The statistics module 310 is comprised of an opportunistic update module 320 and a forced update module 330.

The opportunistic update module 320 works in a manner as described with steps 105 (optionally 110) and 120 from FIG. 1. Thus, the opportunistic update module 320 causes opportunistic updates to the segmented counters. In embodiments that utilize probability functions, the opportunistic update module 320 maintains a set of one or more probability functions 326 that are associated to the plurality of segmented counters. In one embodiment there is a common probability function that is for all of the segmented counters. Alternative embodiments may use a plurality of probability functions for the segmented counters. To make the determination 120, the opportunistic update module includes a mechanism to generate the at least pseudo-random number. In one embodiment, the opportunistic update module 320 includes a linear feedback shift register 327 that uses a seed value to generate an arithmetic sequence of pseudo-random numbers. In another embodiment, the opportunistic update module 320 includes a true random number generator that utilizes unpredictable natural processes to generate truly-random numbers.

Still further, each time the forced update module 330 determines that a forced update must occur 140 and 150, the forced update module causes an update of the secondary part of one of the segmented counters 160. For example, whenever an instruction to read a value from one of the segmented counters is received 140, the forced update module causes the update.

Responsive to determining that an update of the secondary part of a segmented counter 170 should occur, the statistic module 310 initiates an update of the secondary part that is stored in the secondary memory 345. The statistics module 310 retrieves a value from the primary memory 340 storing the corresponding primary part of the segmented counter. This value is added to a value stored in the secondary part and this sum is stored back into the secondary part in the secondary memory 345. As the statistics module 310 reads values from the secondary memory 345 and issues writes to the secondary memory 345 the accesses are issued in the form of secondary memory access requests 355 and secondary memory access responses 357.

In at least one embodiment, the memory controller 305 further comprises a secondary memory access queue 350 that is coupled between the statistics module 310 and the secondary memory 345. Each secondary memory access requests 355 is placed into the secondary memory access queue 350 which is serviced as each secondary memory access completes. In one embodiment, the secondary memory access queue 350 can report the number of requests in the queue back to the statistics module 310 as a queue depth 370. The opportunistic update module 320 can then use the queue depth 370 as part of the determination of whether to initiate an opportunistic update 120. In one embodiment of the invention, the queue depth 370 can be used to change the selected probability function during the determination step 120. In another embodiment of the invention the queue depth 370 can be used to stop all opportunistic updates while the secondary memory access queue 350 is full.

In embodiments utilizing an opportunistic rate limiter 325, the opportunistic update module 320 checks whether the opportunistic rate limiter 325 is active as described with reference to step 110. The advantage of the opportunistic rate limiter 325 is to protect from the unlikely occurrence that a series of opportunistic updates occur close in time and present congestion to the secondary memory 345, which has a longer access time than the primary memory 340. In one embodiment, the opportunistic rate limiter 325 starts a timer each time an opportunistic update occurs and stays active for the duration of that timer. In another embodiment, the opportunistic rate limiter 325 maintains a group of semaphores; each semaphore is used to track each outstanding opportunistic update. The opportunistic rate limiter 325 becomes active when all semaphores are currently in use. In yet another embodiment, the opportunistic rate limiter 325 may activate in response to a measurement of congestions to the secondary memory. In this way, the opportunistic rate limiter 325 enforces a maximum rate of opportunistic updates to the secondary memory 345.

Although, the previous embodiment has been described with specific reference to a line card including processor cores, a memory controller, primary memory, and secondary memory. Other embodiments including a line card with a set of one or more discrete components, a set of one or more network processing complexes, a set of one or more network interfaces, and optionally a set of one or more fabric interfaces (sometimes required to connect together multiple line cards to other line cards and control cards in a system. These components are coupled together through one or more mechanisms (e.g., through point to point electrical connections, through point to multipoint electrical connection, through optical to optical connections). The set of discrete components can include RAM devices, FPGA devices, micro-processor devices, bridge devices, media adaptation components, and special purpose special function devices called ASICs. Such ASICs are usually specified and designed in-house. By way of example, a specific ASIC may couple to a variety of RAM devices, such as RL-DRAM and DDR-RAM, and to other devices such as media adaptation components, fabric interfaces (fabric access processor), and a local line card processor. The specific ASIC may further include the memory controller 305, primary memory 340, and secondary memory 345 as described with reference to FIG. 3. Further embodiments of the specific ASIC may include less or more components (e.g. may include the processor core 302 and the memory controller 305 but not include the primary memory 340 or the secondary memory 345). Furthermore, the different embodiments can be implemented in a single or several ASICs depending on physical constraints and tradeoffs that determine how to partition the solution. And in particular, a single ASIC die could contain both a primary memory controller and a secondary memory controller. Or in other embodiments, the primary memory controller can be in one ASIC while the secondary memory controller can be in a separate ASIC with a communication path between them.

FIG. 4 is a data flow diagram illustrating the maintaining of a plurality of segmented counters according to embodiments of the invention. Along the left is a vertical line, running the length of the figure and ending with an arrow pointing towards the bottom, depicting the progression of time. Along the top are three headings for three vertical columns: "Discrete Events During Processing," "Values in Primary Part of Counter A," and "Values in Secondary Part of Counter A." The headings for the values of the primary part and second part of counter A are enclosed in a dashed box and labeled segmented counter A to show that those two pieces are logically coupled to form the segmented counter A. Under the primary part heading and secondary part heading are labels indicating exemplary number of bits stored in the primary part and the secondary part of counter A. Specifically, FIG. 4 illustrates a segmented counter with 16 total bits, with its primary part having 8 bits and its secondary part having 8 bits. In this embodiment, the secondary part of counter A represents the upper bits of the counter while the primary part represents the lower part of the counter.

Although there are 16 bits combined in the parts of the segmented counter, the counter only has a width of 15 bits because the lowest bit of the secondary part overlaps with the highest bit of the primary part. In this sense, bit 7 (0 being the low order bit) of the primary part can represent a value of $2^7$ (128), but also bit 0 of the secondary part can represent the value of $2^7$ in the segmented counter. In this embodiment, the total value of the segmented counter is found by binary shifting the secondary part to the left, 7 bits in this example, and determining the sum of the primary part and the binary shifted secondary part. Therefore the segmented counter, given 16 bits, can store the values 0-32767; 15 bits worth of storage. It should be understood that although this embodiment contemplates 1 bit of overlap, other embodiments may utilize a plurality of overlap bits.

Going down the figure, eight discrete rows (a)-(h) are labeled in the first column and the value stored in the primary part and secondary part of counter is indicated in the second and third column respectively.

The first discrete row (a) is some point during normal processing in the system. The value of the segmented counter A is 1282, with the value 130 stored in the primary part and the value 9 stored in the secondary part. The value 9 in the secondary part represents 1152 in the segmented counter after being binary shifted to the left 7 bit positions. For example, the binary representation of 9 is 1001 and is binary shifted left 7 positions to 10010000000. Adding the binary value 100 10000000 to the binary representation of 130, 10000010, gives the sum of 10100000010, 1282 in decimal notation. In the previous text and in FIG. 4, the bit of overlap is underlined.

At discrete row (b), segmented counter A is incremented by adding one to the primary part, making the total 1283, with 131 in the primary part and 9 in the secondary part. At discrete row (c), it is determined that an opportunistic update of the secondary part of segmented counter A should occur. This opportunistic update determination occurs as described with reference to FIG. 1, although an added check occurs such that no update is made when the value stored in the primary part is less than 128 as no change to the secondary part is needed for values 0-127. At this point, a dashed arrow is shown going from the primary part to the secondary part to indicate that 1 is added to the secondary part. One is added because the value of the overlap bit, bit position 7, in the primary part is set to a 1 and this bit, worth 128 in the primary part, is worth 1 in the secondary part. At discrete row (c) the secondary part transitions to 10 while the primary part transitions to 3, which is 128 less than its previous value (that is, is updated to a value further from its roll over point). The segmented counter now has 00000011 (3) in the primary part and 00001010 (10, or 1278 after binary shifting) in the secondary part. The total value of the segmented counter is 000010100000011 (1283) after binary shifting and adding as previously described.

Discrete row (d) indicates that a series of increments to segmented counter A have occurred incrementing the value of the segmented counter to 1535; the value stored in the secondary part is still 10 at this point. The primary part is at its limit of 255, all bits set to 1. The primary part reached its limit because there were no intervening opportunistic updates while the segmented counter was incremented from discrete row (c) to discrete row (d). The opportunistic updates may not occur because the opportunistic update determination may have come up as no update at each check or because there was congestion to secondary memory when attempting prior opportunistic updates causing them to fail. Discrete row (e) indicates another increment to the segmented counter causing the primary part to rollover from 255 to 0 and set a carry-over flag indicating a rollover condition. In this case, the secondary part of the segmented counter needs to be updated prior to the primary part incrementing to 255 again so that the previous 256 increments are not lost in the total value of the counter. At discrete row (f), a forced update due to reaching the primary part threshold, indicated by the carry-over flag, is initiated. At this point the primary part is storing a value of 0, but there is also a carry-over flag set from the rollover and the secondary part is storing a value of 10. A dashed arrow is shown to indicate that 2 is added to the second part because the carry-over flag is worth 256 which is a 1 in bit position 1 of the secondary part. After the forced update, the carry-over flag can be reset and the secondary part is storing 12, which is worth 1536 after being binary shifted 7 times to the left.

Discrete row (g) indicates that a series of updates to segmented counter A have raised the value of the primary part from 0 to 154. At this point, the secondary part is still set to 12 making the total value 1690, after binary shifting and adding as described above. Discrete row (h) shows a forced update that occurred in response to receiving an instruction that required a forced update, as described with reference to FIG. 1. A dashed arrow is shown going from the primary part to the secondary part to indicate that the value 1 is being added to the secondary part since the value in the primary part is greater than 127. The primary part is shown subtracted by 128, or having bit position 7 cleared, while the secondary part is now set to 13. The binary shifting and adding is illustrated in a solid box for discrete row (h). The primary part, now set to 00011010 (26), is used for the low order bits while the shifted bits of secondary part, 0000110100000000 (13 before shifting and 1664 after shifting), are used to generate a total of 1690 for the segmented counter.

FIG. 5 is a block diagram illustrating a line card of a network element including a memory controller, a primary memory, and a secondary memory in which a plurality of segmented counters are maintained according to a second embodiment of the invention. The line card 501 in FIG. 5 is similar to the line card 301 of FIG. 3 and operates in the same manner except for the statistics module 510 and the secondary part of the segmented counter stored in the secondary memory 345. The statistics module 510 operates in a manner similar to the statistics module 310 except: 1) the manner in which it performs updates to the secondary part and the primary part of the segmented counters; 2) an additional check it performs prior to performing an update (opportunistic or forced); and 3) the manner in which it returns a read of the segmented counters.

With respect to the manner in which the statistic module 510 updates the secondary part and the primary part of the segmented counters, the statistics module 510 takes the set of one or more overlap bits in the primary part A and binary shifts them to the right so that the lowest order overlap bit of the primary part lines up with the lowest order overlap bit of the secondary part, which would be bit 0 of the secondary part. For example, using the two 8 bit parts as described in FIG. 4, with one bit of overlap then the value stored in the 7th bit position of the primary part would be shifted right 7 places and added to bit position 0 of the secondary part. In another embodiment using 3 bits of overlap, bits 5-7 of the primary part would be binary shifted to line up with bits 0-2 and added to the secondary part of the segmented counter. In another embodiment utilizing a carry-over flag, the update of the secondary parts would also include adding the carry-over flag to the lowest order bit that is not an overlap in the secondary part since the carry-over flag would represent that more than the overlap needs to be added to the secondary part. In all of these embodiments, the overlap bits in the primary part and the carry-flag should be set to 0 after the update to the secondary part (that is, updated to a value further from its roll over point).

Anytime it is determined that an update to the secondary part of a segmented counter should occur an additional check is performed prior to performing the update. In this embodiment the statistic module 510 first ensures that at least one of the one or more overlap bits, or the carry-flag, is set to 1 in the primary part prior to performing the update. If none of the overlap bits, or the carry-flag, in the primary part are set to 1, then no update is required and the statistics module 510 continues on to processing. If an update is needed, then the statistics module 510 performs the update to the secondary part as described above and continues on with processing.

This embodiment of the invention has the advantage that during reads of the segmented counter, the secondary part of that segmented counter need not be updated prior to reading the value. Instead, in one embodiment, the memory controller reads the primary part and the secondary part of the segmented counter; shifts the secondary part to the left so that the highest order overlap bit in the primary part lines up with the highest order overlap bit in the secondary part; adds the two numbers together to form the total value of the segmented counter; and returns this value as the value of the segmented counter. While in one embodiment the shifting and adding is done by in the processor core after the memory controller returns the primary part and the secondary part. Alternative embodiments of the invention leave one or both of these tasks to be performed (e.g., software may receive both numbers and be responsible for adding or shifting and adding them).

In this embodiment, the secondary part of each segmented counter stored in the secondary memory 345 comprises all of the bits of the segmented counter not stored in the primary part and at least one overlap bit. In FIG. 5, the primary part and the secondary part of each segmented counter are shown in a relationship with a curved-dashed line ending with arrows on each end. This line is to indicate that the two parts are logically coupled to make up a segmented counter. FIG. 5 shows the primary memory 340 stores the N bits for the low order bit positions 0 through M in the primary part, as in FIG. 3. However, differentiated from FIG. 3, FIG. 5 stores V bits in the secondary memory for the high order bit positions. In one embodiment having one bit of overlap, the secondary memory 345 stores the high order bit positions M through U in the secondary part of the segmented counter giving the segmented counter a width of (N+V−1). In another embodiment having D of overlap bits, the secondary memory 345 stores bit positions K through S giving the segmented counter a width of (N+V−D). Thus, with reference to FIG. 4 using 8 bits for each part (e.g. N=8 and V=8) and 1 bit of overlap, the segmented counter is 15 bits wide and capable of storing unsigned values 0-32767. The primary part would hold bit positions 0 through 7 (8 bits for N) and the secondary part would hold bit positions 7 through 14 (8 bits for V with 1 bit overlap). The same Figure utilizing 3 bits of overlap would have bit positions 0 through 7 (8 bits for N) in the primary part and bit positions 5 through 12 (8 bits for V with 3 bits overlap) in the secondary part; 13 bits wide total and capable of storing values 0 through 8191. The updating of the primary part and secondary part of the segmented counter in FIG. 5 operates in the manner described in FIG. 4.

Alternative Embodiments

While embodiments of the invention have been described in relation to the primary memory having a faster access time than the secondary memory, other embodiments may utilize memories having different power consumption characteristics. Therefore, embodiments of the invention are not limited to two memories with different access time characteristics. In addition, while embodiments of the invention have been described in relation to segmenting a counter into two parts in two memories, alternative embodiments could be implemented such that a counter is segmented into more than two parts and stored in more than two memories accordingly.

Such an embodiment could be implemented by having a primary part, a secondary part, and a tertiary part. As such, roll-overs from the primary part would update the secondary part and roll-overs from the secondary part would update the tertiary part.

Furthermore, while the flow diagrams in the figures show a particular order of operations performed by certain embodiments of the invention, it should be understood that such order is exemplary (e.g., alternative embodiments may perform the operations in a different order, combine certain operations, overlap certain operations, etc.).

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

What is claimed is:

1. A method performed in a memory controller for maintaining a plurality of segmented counters, wherein the memory controller is coupled to a primary memory, and a secondary memory, wherein the primary memory has a shorter access time than the secondary memory, the method comprising the steps of:
    responsive to each event requiring an update of one of the plurality of segmented counters, immediately updating a primary part of that segmented counter stored in the primary memory, wherein the primary parts include the lower order bit positions of the plurality of segmented counters;
    responsive to each time one of the primary parts is rolling over, determining to update a secondary part of that segmented counter stored in the secondary memory, wherein the secondary parts include less than all of the bit positions of the plurality of segmented counters included in the primary parts, and wherein a value of that segmented counter is a sum of the primary part of that segmented counter, and the secondary part of that segmented counter being shifted by a number of overlapping bits between the primary part and the second part of that segmented counter;
    periodically and independently of the events, determining for each of the plurality of segmented counters, based on a current probability function and a current at least pseudo-random number, whether to opportunistically update the secondary part of that segmented counter stored in the secondary memory;
    each time it is determined to update the secondary part of one of the plurality of segmented counters, performing the steps of:
        updating the secondary part of the segmented counter; and
        updating the primary part of the segmented counter, whereby updates of the secondary parts are distributed probabilistically over time.

2. The method of claim 1, wherein the step of updating the primary part of the segmented counter includes resetting the primary part of the segmented counter.

3. The method of claim 1, wherein the step of periodically determining further comprises the step of:
    determining whether an opportunistic rate limiter is active, wherein it is determined not to opportunistically update the secondary part of that segmented counter when the rate limiter is active.

4. The method of claim 1, further comprising the step of:
    receiving an instruction associated with one of the plurality of segmented counters; and
    determining, based on the instruction, whether to force an update to the secondary part of that segmented counter.

5. The method of claim 1, wherein the step of updating the secondary part of the segmented counter includes the step of:
    determining, based on a comparison of the primary part of the segmented counter to a threshold value, whether to force an update to the secondary part of the segmented counter, wherein the threshold value specifies that the primary part of the segmented counter is rolling over or soon to roll over.

6. The method of claim 1, wherein the step of periodically determining includes the steps of:
    determining the current probability function to apply based on a queue depth of a secondary memory access queue and based on a comparison of the primary part of the segmented counter to a threshold value, wherein the threshold value specifies that the primary part of the segmented counter is soon to roll over, and wherein the step of reading includes the step of placing into the secondary memory access queue a request to access the secondary part of the segmented counter in the secondary memory.

7. A memory controller, to be coupled to a primary memory, and a second memory, to maintain a plurality of segmented counters, wherein the primary memory is to have a faster access time than the secondary memory and the memory controller comprises:
    a statistics module configured to initiate updates of the plurality of segmented counters, each segmented counter to be comprised of a primary part to be stored in the primary memory and a secondary part to be stored in the secondary memory wherein the primary parts are to include the lower order bit positions of the plurality of segmented counters and the secondary parts are to include less than all of the bit positions of the plurality of segmented counters included in the primary parts, and wherein a value of that segmented counter is a sum of the primary part of that segmented counter, and the secondary part of that segmented counter being shifted by a number of overlapping bits between the primary part and the second part of that segmented counter, the statistics module comprising:
        an opportunistic update module configured to:
            determine a probability function corresponding to each of the plurality of segmented counters, and
            probabilistically initiate, based on the determined probability functions, one or more opportunistic updates of the secondary parts, and
        a forced update module configured to initiate one or more forced updates of the secondary parts; and
    a secondary memory access queue, coupled between the secondary memory and the statistics module, configured to:
        store one or more secondary memory access requests, wherein one or more of the secondary memory access requests is to request an update of one of the secondary parts, and
        perform the one or more secondary memory access requests, whereby updates of the secondary parts are distributed probabilistically over time.

8. The memory controller of claim 7, wherein the probability functions to apply are determined based on an indication of a queue depth of the secondary memory access queue and based on a comparison of the primary parts of the segmented counters to threshold values, wherein the threshold values are to indicate when the primary parts of the segmented counters will approach a roll over point.

9. The memory controller of claim 7, wherein the statistics module further comprises:
an opportunistic rate limiter configured to prevent one or more opportunistic updates while the opportunistic rate limiter is active.

10. The memory controller of claim 9, wherein the opportunistic rate limiter is further configured to:
start a timer after each opportunistic update; and
activate, responsive to the start of the timer, to prevent one or more additional opportunistic updates whereby the opportunistic rate limiter can prevent a rapid succession of multiple opportunistic updates.

11. The memory controller of claim 9, wherein the opportunistic rate limiter is further configured to:
receive an indication of a queue depth of the second memory access queue; and
activate, responsive to the indication, to prevent one or more additional opportunistic updates whereby the opportunistic rate limiter can minimize the number of memory access requests in the secondary memory access queue.

12. A line card to maintain a plurality of segmented counters, each segmented counter to be comprised of a primary part and a secondary part wherein the primary parts are to include the lower order bit positions of the plurality of segmented counters and the secondary parts are to include at least all of the bit positions of the plurality of segmented counters not included in the primary parts, the line card comprising:
one or more processor cores configured to:
transmit instructions, at least one of the instructions to indicate that one of the plurality of segmented counters should be updated and at least one of the instructions to indicate a request for the state of one of the plurality of segmented counters;
a primary memory to store the primary parts;
a secondary memory to the secondary parts, wherein the secondary memory has a longer access time than the primary memory, and wherein the secondary parts stored in the secondary memory include less than all of the bit positions of the plurality of segmented counters included in the primary parts, and wherein a value of that segmented counter is a sum of the primary part of that segmented counter, and the secondary part of that segmented counter being shifted by a number of overlapping bits between the primary part and the second part of that segmented counter; and
a memory controller coupled between the one or more processor cores, the primary memory, and the secondary memory, the memory controller configured to receive instructions from the one or more processor cores, the memory controller comprising:
an opportunistic update module configured to periodically determine, for each of the plurality of segmented counters based on a probability function and an at least pseudo-random number, whether to opportunistically update the secondary parts, wherein updates of the secondary parts results in resets of the primary parts, whereby opportunistic updates of the secondary parts are distributed probabilistically over time, and
a forced update module configured to:
determine, based on the received instructions, to update the secondary part of one of the plurality of segmented counters associated with the received instruction, and
determine, based on avoidance of the primary parts of the segmented counters rolling over without updates to their secondary parts, to force updates to the secondary parts, whereby failures of the opportunistic update module to opportunistically update the secondary parts and reset the primary parts prior to roll over is avoided.

13. The line card of claim 12, wherein the memory controller is further configured to:
read the secondary parts from the secondary memory;
add the primary parts to the secondary parts;
reset the primary parts; and
store the result of the additions as the secondary parts.

14. The line card of claim 12, wherein the memory controller further comprises:
a second memory access queue, coupled between the memory controller and the second memory, configured to:
store one or more secondary memory access requests, and
perform the one or more secondary memory access requests.

15. The line card of claim 12, wherein the opportunistic update module further comprises:
an opportunistic rate limiter configured to prevent one or more opportunistic updates while the opportunistic rate limiter is active.

16. The line card of claim 15, further comprising a linear feedback shift register (LFSR), coupled to the opportunistic update module, to generate the at least pseudo-random numbers.

17. The line card of claim 15, wherein the opportunistic rate limiter is further configured to:
start a timer after each of the opportunistic updates; and
activate, responsive to the start of the timer, to prevent one or more additional opportunistic updates while active, whereby the opportunistic rate limiter can prevent a rapid succession of multiple opportunistic updates.

18. The line card of claim 15, wherein the opportunistic rate limiter is further configured to:
receive an indication of a queue depth of the second memory access queue; and activate, responsive to the indication, to prevent one or more additional opportunistic updates, whereby the opportunistic rate limiter can minimize the number memory access requests in the secondary memory access queue.

* * * * *